(12) United States Patent
Park et al.

(10) Patent No.: US 8,994,922 B2
(45) Date of Patent: Mar. 31, 2015

(54) LENS BARREL SUPPORT DEVICE AND MASKLESS EXPOSURE APPARATUS HAVING THE SAME

(75) Inventors: Sang Hyun Park, Yongin-si (KR); Sang Joon Hong, Suwon-si (KR); Sang Don Jang, Ansan-si (KR); Oui Serg Kim, Seongnam-si (KR); Dong Seok Baek, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1203 days.

(21) Appl. No.: 12/923,939

(22) Filed: Oct. 15, 2010

(65) Prior Publication Data
US 2011/0090478 A1   Apr. 21, 2011

(30) Foreign Application Priority Data
Oct. 20, 2009   (KR) ........................ 10-2009-0099958

(51) Int. Cl.
*G02B 7/02*   (2006.01)
*G03F 7/20*   (2006.01)
*G03B 27/54*   (2006.01)

(52) U.S. Cl.
CPC ............ *G02B 7/023* (2013.01); *G03F 7/70275* (2013.01); *G03B 27/54* (2013.01); *G03F 7/70833* (2013.01)

USPC ................. 355/67; 353/101; 355/46; 355/55; 355/77

(58) Field of Classification Search
CPC ................ G02B 7/021–7/023; G03F 7/70275; G03F 7/70833
USPC ............ 353/100, 101; 355/46, 52, 53, 55, 67, 355/77; 359/819, 822–830
See application file for complete search history.

(56) References Cited

U.S. PATENT DOCUMENTS 3,250,197 A * 5/1966 Smith et al. .................... 396/144
2005/0007572 A1 * 1/2005 George et al. .................. 355/55

* cited by examiner

*Primary Examiner* — Colin Kreutzer
(74) *Attorney, Agent, or Firm* — Harness, Dickey Pierce, P.L.C.

(57) ABSTRACT

Provided is a barrel support device for supporting a lens barrel. The barrel support device may include a guide frame configured to laterally support the lens barrel and tilt with the lens barrel, a rotation guide on a first end of the guide frame, the rotation guide being ring shaped and configured attach the lens barrel to the guide frame, and a ring-shaped tilting frame configured to support a second end of the guide frame and tilt the guide frame, wherein the guide frame, the rotation guide, and the tilting frame are configured to allow the lens barrel to pass therethrough.

20 Claims, 9 Drawing Sheets

LENS BARREL SUPPORT DEVICE AND MASKLESS EXPOSURE APPARATUS HAVING THE SAME

CROSS-REFERENCE TO RELATED APPLICATION

This application claims priority under 35 U.S.C. §119 to Korean Patent Application No. 2009-0099958, filed on Oct. 20, 2009 in the Korean Intellectual Property Office (KIPO), the entire contents of which are herein incorporated by reference.

BACKGROUND

1. Field

Example embodiments relate to a lens barrel support device which may guide laser light onto a substrate to form a pattern on the substrate, and a maskless exposure apparatus having the lens barrel support device.

2. Description of the Related Art

Exposure apparatuses are apparatuses which may align a mask provided with a pattern on a substrate provided with a photoresist layer formed on the surface thereof, and then irradiate light onto the photoresist layer of the substrate through the mask so as to from a pattern corresponding to the pattern of the mask on the photoresist layer. However, there is a maskless exposure apparatus which irradiates light having a pattern directly onto a substrate without a mask so as to form a pattern corresponding to the pattern of the light directly on the substrate.

The maskless exposure apparatus uses a light modulator and thus requires a two-step projection optical system focusing light or enlarging light intervals as well as an illumination optical system provided in a lens barrel guiding and irradiating light onto a substrate. Therefore, the lens barrel used in the maskless exposure apparatus has a greater length than that of a lens barrel used in a general exposure apparatus.

SUMMARY

Example embodiments provide a maskless exposure apparatus which finely adjusts positions and angles of lens barrels.

Example embodiments will be set forth in part in the description which follows and, in part, will be obvious from the description, or may be learned by practice of example embodiments.

In accordance with example embodiments, a barrel support device for supporting a lens barrel may include a guide frame configured to laterally support the lens barrel and tilt with the lens barrel, a rotation guide on a first end of the guide frame, the rotation guide being ring shaped and configured attach the lens barrel to the guide frame, and a ring-shaped tilting frame configured to support a second end of the guide frame and tilt the guide frame, wherein the guide frame, the rotation guide, and the tilting frame are configured to allow the lens barrel to pass therethrough.

In accordance with example embodiments, a barrel support device is provided. The barrel support device may support a lens barrel configured to guide light to a substrate. The barrel support device may support the lens barrel such that the lens barrel may be rotated around a first axis that is an axis of the lens barrel and may be tilted around a second axis and a third axis perpendicular to the first axis and perpendicular to each other.

The barrel support device may include a guide frame passing the lens barrel therethrough and tilted together with the lens barrel, a rotation guide formed in a ring shape and rotatably installed on one end of the guide frame to fix the lens barrel therein, and a tilting frame passing the lens barrel therethrough and formed in a ring shape to tiltably support the other end of the guide frame.

The barrel support device may further include a main frame in which the guide frame is tiltably and rotatably installed, and a sub frame, into which the tilting frame is fixed, provided with one end fixed to the main frame.

The barrel support device may further include a bearing unit disposed between the rotation guide and the guide frame to rotatably support the rotation guide to the guide frame.

In example embodiments, a through hole in which the guide frame is installed may be formed through the main frame, and the barrel support device may further include separation prevention members installed on the main frame to support the rotation guide so as to maintain an installed state of the rotation guide, the bearing unit, and the guide frame in the main frame.

A plurality of separation prevention members may be separated from each other in the circumferential direction.

The rotation guide may be installed at a position corresponding to the center of gravity of the lens barrel.

The barrel support device may further include first guide members formed on the rotation guide, second guide members formed on the bearing unit corresponding to the first guide members, and an interval adjustment unit to adjust an interval between the first guide members and the second guide members.

Rotation guide recesses, in which the first guide members are installed such that they can move in the circumferential direction, may be provided on the rotation guide.

In example embodiments, the first guide members and the second guide members may be respectively provided in a pair so as to correspond to each other, an interval between one of the first guide members and one of the second guide members may be adjusted by the interval adjustment unit, and the barrel support device may further include an interval maintenance unit to maintain an interval between the other one of the first guide members and the other one of the second guide members.

The barrel support device may further include a flexible hinge provided with one side installed on the rotation guide and the other side installed on the bearing unit to achieve relative displacements of the rotation guide and the bearing unit and to have rigidities of the rotation guide and the bearing unit in a rotating direction.

The barrel support device may further include a plurality of tilting guides separated from each other in the circumferential direction, installed on the tilting frame such that they can move forward and backward, and respectively provided with front ends to support the other end of the guide frame, and tilting guide holes in which the tilting guides are respectively installed such that they can move forward and backward.

The barrel support device may further include differential tilting screws screw-connected to the tilting frame and moving forward and backward in the axial direction according to the rotating direction thereof to move the tilting guides and the guide frame forward and backward, and tilting screw holes, with which the differential tilting screws are respectively coupled, provided on the tilting frame.

The barrel support device may further include support members installed on the other end of the guide frame to support the front ends of the tilting guides.

In example embodiments, clamping grooves may be provided to protrude partial regions of the tilting guide holes to the insides of the tilting guide holes, and first clamping parts and second clamping parts respectively extended from regions of the tilting frame adjacent to both sides of the clamping grooves may be provided on the tilting frame, and the barrel support device may further include clamping screws each of which is screw-connected to the each first clamping part and each second clamping part to adjust an interval between each first clamping part and each second clamping part.

The barrel support device may further include fixing pins passing through the guide frame and the sub frame to maintain a supported state of the other end of the guide frame by the front ends of the tilting guides.

The barrel support device may further include a movement guide on which the main frame is installed such that the main frame can move forward and backward in the direction of the third axis, and first rails and second rails respectively extended in the direction of the second axis so as to install the main frame on the movement guide such that the main frame can move forward and backward in the direction of the third axis.

In accordance with example embodiments, a maskless exposure apparatus may include barrel support devices, each of which supports a lens barrel guiding light to a substrate, wherein the barrel support device supports the lens barrel such that the lens barrel can be rotated around a first axis that is an axis of the lens barrel and can be tilted around a second axis and a third axis perpendicular to the first axis and perpendicular to each other.

The substrate may move in one direction and light guided by the lens barrel may be irradiated onto the substrate, and the second axis may be parallel with the movement direction of the substrate.

A plurality of lens barrels may be arranged in a plurality of rows, and the third axis may be parallel with the arrangement direction of the plurality of lens barrels.

BRIEF DESCRIPTION OF THE DRAWINGS

These and/or other aspects of example embodiments will become apparent and more readily appreciated from the following description of example embodiments, taken in conjunction with the accompanying drawings of which.

DETAILED DESCRIPTION

Figure 1:
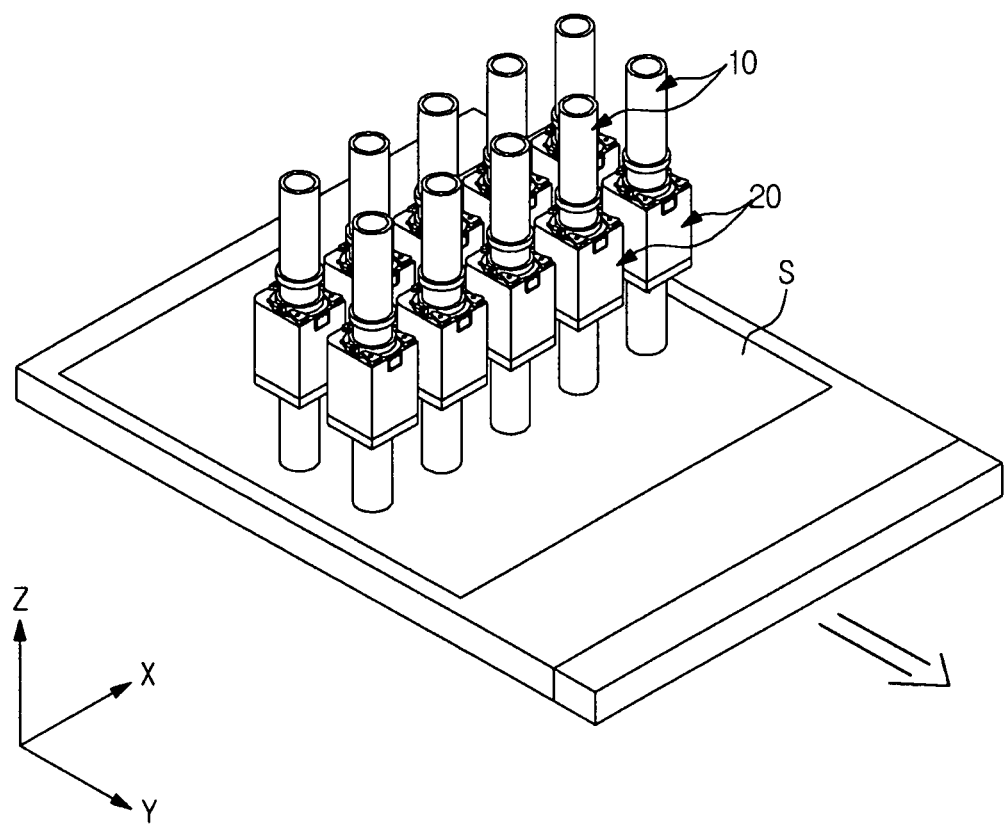
FIG. 1 is a schematic view of a maskless exposure apparatus in accordance with example embodiments.

Example embodiments will now be described more fully with reference to the accompanying drawings, in which example embodiments are shown. The invention may, however, be embodied in different forms and should not be construed as limited to example embodiments set forth herein. Rather, example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Reference will now be made in detail to example embodiments, examples of which are illustrated in the accompanying drawings, wherein like reference numerals refer to like elements throughout.

FIG. 1 illustrates a maskless exposure apparatus in accordance with example embodiments. As shown in FIG. 1, the maskless exposure apparatus in accordance example embodiments may include a plurality of lens barrels 10 configured to guide light. The lens barrels 10 may guide light in a first direction that may be parallel or coincident with the illustrated Z axis. In example embodiments, the Z axis may be in the direction of an axis of a lens barrel 10. In example embodiments, the lens barrels 10 may irradiate light onto a substrate S that may be moving in a second direction perpendicular to the first direction. Plural lens barrels 10 may be arranged in parallel in a third direction which may be respectively perpendicular to the first direction and the second direction. In example embodiments, the second direction may be in the direction of the illustrated Y-axis and the third direction may be in the direction of the illustrated X-axis.

In example embodiments, the lens barrels 10 may be arranged in two rows. The lens barrels 10 of one row may be arranged to have spaces therebetween and the lens barrels 10 of the other row may likewise be arranged to have spaces therebetween. In example embodiments, the lens barrels 10 of the one row and the lens barrels 10 of the other row may be arranged such that regions of light guided by the lens barrels 10 of the one row and regions of light guided by the lens barrels 10 of the other row are inline with each other. Example embodiments, however, are not limited to the above arrangement. For example, the lens barrels 10 of the one row may be offset from the lens barrels 10 of the other row.

In example embodiments, the maskless exposure apparatus may irradiate light directly onto the substrate S to form a pattern on the substrate S, therefore, it may be required that the lens barrels 10 are located at correct positions and angles. The correct angles and positions may or may not be predetermined.

In example embodiments, the lens barrels 10 may have a relatively long length, and thus installation of the lens barrels 10 at correct positions and angles may be difficult. Additionally, even if the lens barrels 10 are located at correct positions and angles, the positions and the angles of the lens barrels 10 may be finely twisted or displaced during use, for several reasons. For example, the lens barrels 10 may be subject to a mechanical shock that may displace the lens barrels 10.

In example embodiments, the maskless exposure apparatus may include barrel support devices 20 to finely adjust positions and angles of the lens barrels 10.

In example embodiments, the barrel support devices 20 may support the lens barrels 10 such that the lens barrels 10 can be rotated around the lens barrel's axis which may be parallel to the Z axis illustrated in FIG. 1. The barrel support devices 20 may also be configured to tilt the lens barrels 10. For example, the support devices 20 may be configured to rotate the lens barrels 10 about the X and Y axes illustrated in FIG. 1.

In example embodiments, a barrel support device 20 may include a guide frame 210, a rotation guide 220, a tilting frame 230, a cross roller bearing 221, and a bearing unit 240. The guide frame 210 may be configured to allow the lens barrel 10 to pass therethrough and may be further configured to be tilted together with the lens barrel 10. The guide frame 210 may be configured to laterally and axially support the lens barrel 10. The tilting frame 230 may be configured to allow the lens barrel 10 to pass therethrough and may be formed in a ring shape to tiltably support the guide frame 210. The rotation guide 220 may be configured to allow the lens barrel 10 to pass therethrough and may be formed in a ring shape. In example embodiments, the rotation guide 220 may be rotatably installed on one end of the guide frame 210 to fix the lens barrel 10. For example, the lens barrel 10 and the rotation guide 220 may be coupled to each other by a fastening member, for example, a screw. The bearing unit 240 may be provided with a bearing 241 that may be installed on an inner surface thereof. The bearing unit 240 may be interposed between an end of the guide frame 210 and the rotation guide 220 to allow the rotation guide 220 to be rotatably supported by the end of the guide frame 210. In example embodiments, the rotation guide 220, to which the lens barrel 10 may be attached, may be installed at a position corresponding to the center of gravity of the lens barrel 10 so as to stably support the lens barrel 10.

The barrel support device 20 may further include a main frame 250 in which the guide frame 210 may be tiltably and rotatably installed, and a sub frame 260, in which the tilting frame 230 may be installed. In example embodiments, the sub frame 260 may be fixed to the lower end of the main frame 250. For example, the main frame 250 may be coupled to the sub frame 260 by a fastening member, for example, a screw.

Figure 5:
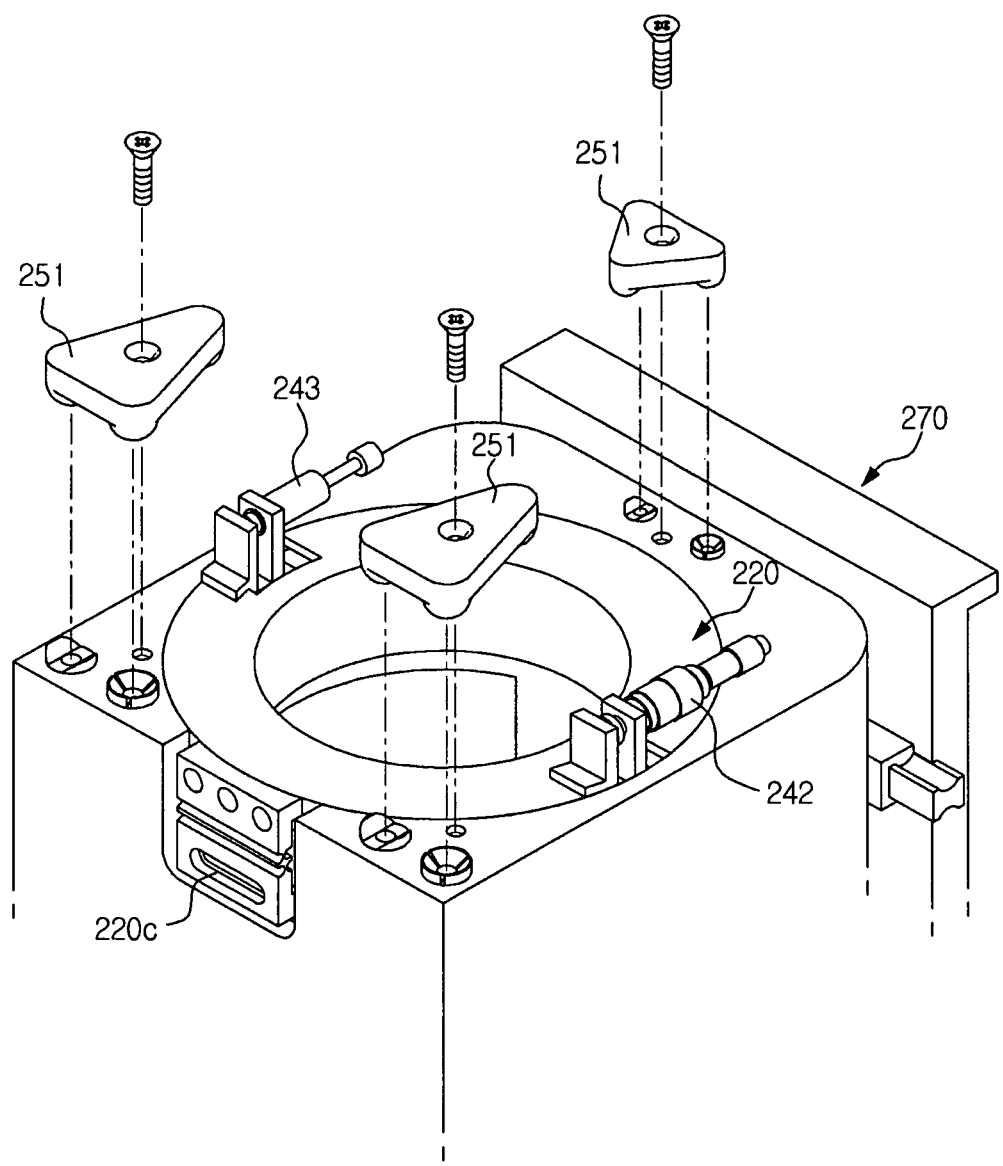
FIG. 5 is a perspective view illustrating installation of separation prevention members applied to the maskless exposure apparatus in accordance with example embodiments.

In example embodiments, the main frame 250 may include a through hole 250a in which the guide frame 210, the rotation guide 220, and the bearing unit 240 may be accommodated. In example embodiments, the lens barrel 10 may pass through the through hole 250a. A plurality of separation prevention members 251 (see FIG. 5) may be provided on the main frame 250 to fix the guide frame 210, the rotation guide 220, and the bearing unit 240 in the through hole 250a. In example embodiments, the plurality of separation prevention members 251 may be provided on an upper end of the main frame 250 and may be separated from each other in a circumferential direction as shown in FIG. 5. Therefore, after the guide frame 210, the rotation guide 220, and the bearing unit 240 are installed in the main frame 250, the separation prevention members 251 may be fixed to the upper end of the main frame 250, as shown in FIG. 5, thereby fixing the rotation guide 220 and the guide frame 210 to the inside of the main frame 250 under the condition that the rotation guide 220 is rotatable and the guide frame 250 is tiltable.

Referring back to FIG. 2, an installation hole 260a, in which the tilting frame 230 is installed and through which the lens barrel 10 passes, may be provided on the sub frame 260. The sub frame 260 may include one or more flanges 300 within the installation hole 260a to prevent the tilting frame 230 from passing therethrough.

Figure 3:
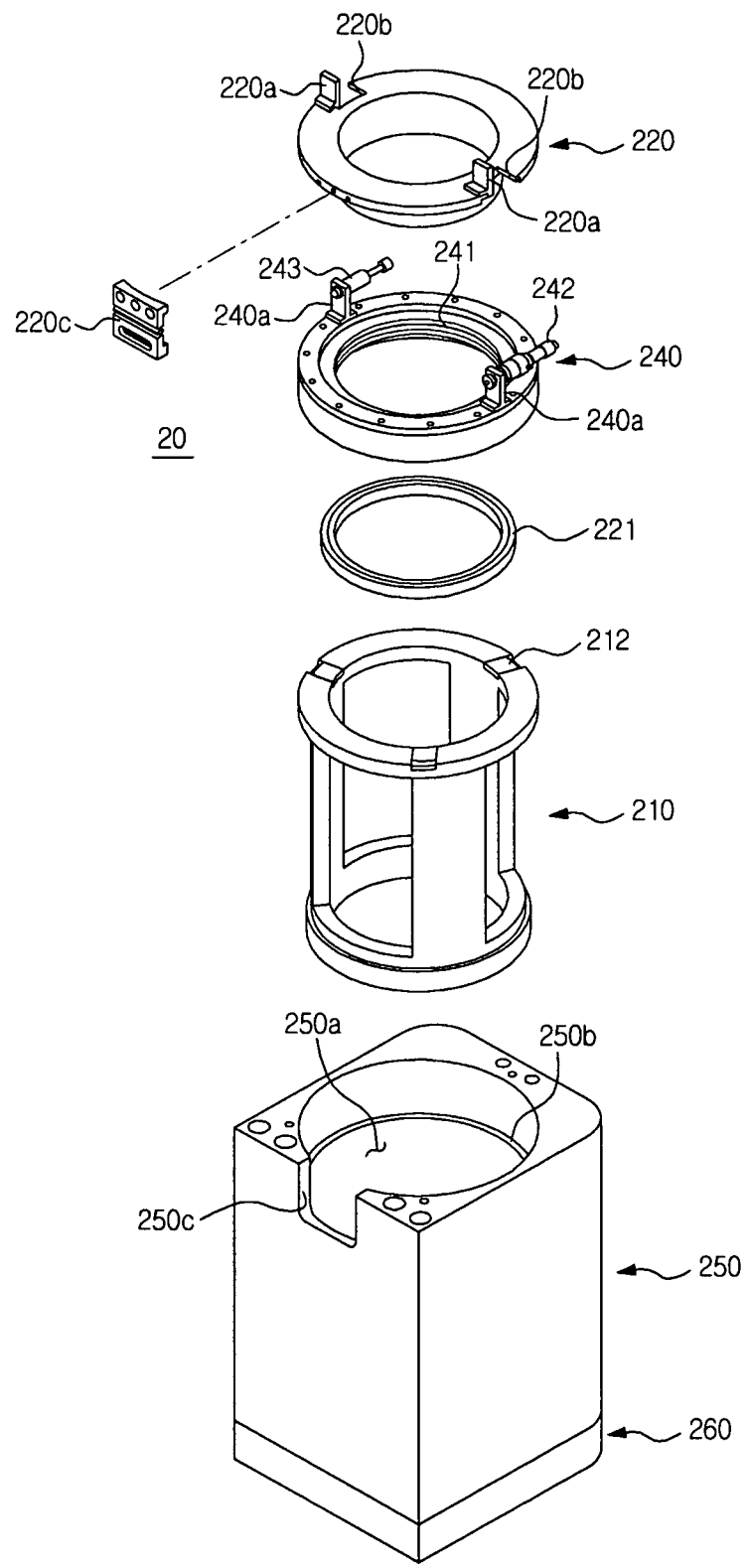

Referring to FIG. 3, first guide members 220a may be installed on the rotation guide 220 so as to allow the lens barrel 10 to be rotated around the Z axis (which may correspond to an axis of the lens barrel 10), and second guide members 240a corresponding to the first guide members 220a may be installed on the bearing unit 240. In example embodiments, the second guide members 240a may pass through the rotation guide 220 and may be disposed corresponding to the first guide members 220a. In example embodiments, rotation guide recesses 220b, through which the second guide members 240a pass, may be extended in the circumferential direction to allow the second guide members 220a to move within a designated range in the circumferential direction, are provided on the rotation guide 220.

Figure 4:
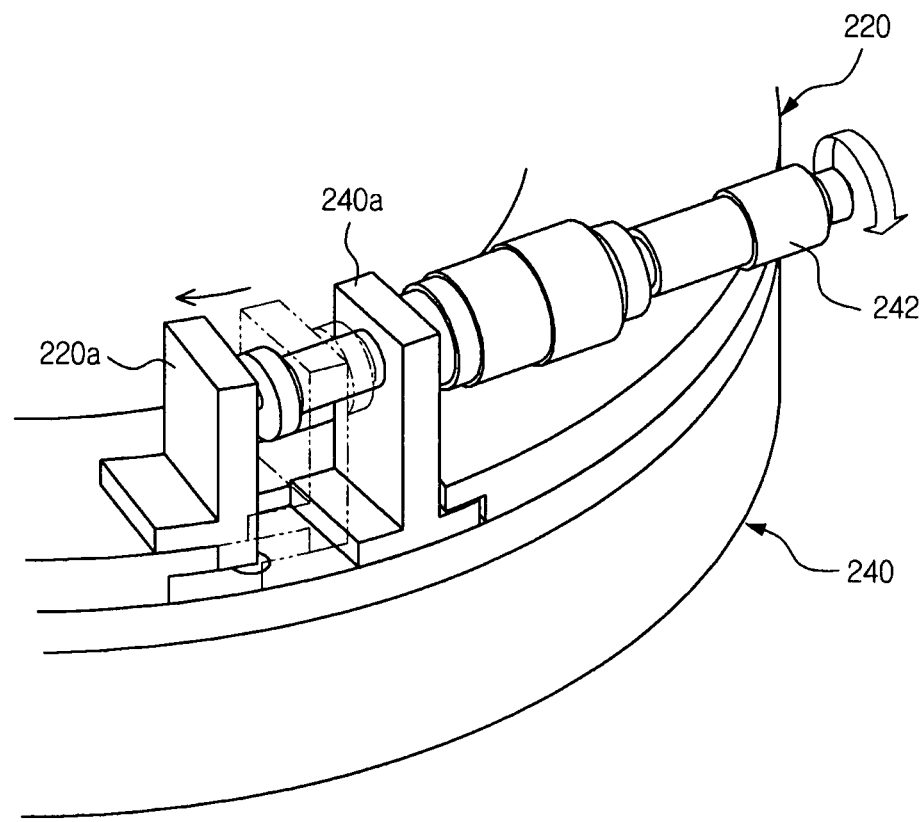
FIG. 4 is a perspective view illustrating operation of an interval adjustment device applied to the maskless exposure apparatus in accordance with example embodiments.

The first guide members 220a and the second guide members 240a may be respectively provided in a pair so as to correspond to each other. An interval adjustment unit 242 may be installed at one second guide piece 240*a* so as to adjust an interval with the first guide piece 220*a* corresponding to the second guide piece 240*a*, and an interval maintenance unit 243 may be installed at the other second guide piece 240*a* to maintain the interval between the first guide piece 220*a* and the second guide piece 240*a*, adjusted by the interval adjustment unit 242. In example embodiments, the interval between one first guide piece 220*a* and the corresponding second guide piece 240*a* may be adjusted by rotating the interval adjustment unit 242, as shown in FIG. 4, and then the interval between the other first guide piece 220*a* and the corresponding second guide piece 240*a* may be maintained by the interval maintenance unit 243, as shown in FIG. 5, thereby maintaining the rotated state of the rotation guide 220 and the lens barrel 10. In example embodiments, the interval maintenance unit 243 may include a coil spring arranged therein. An end of the interval maintenance unit 243, which may be arranged at the second guide members 240*a*, may be protruded toward the first guide members 220*a* by a resilience of the coil spring, and may be supported by the second guide members 240*a*.

In example embodiments, the rotation of the rotation guide 220 may be restrictively achieved within a designated range. The range, for example, may or may not be predetermined. For this reason, a flexible hinge 220*c* may be provided with one side installed on the rotation guide 220 and the other side installed on the bearing unit 240. In example embodiments, the flexible hinge 220*c* may be arranged between the two first guide members 220*a* or between the two second guide members 240*a*, and thus relative displacements of the rotation guide 220 and the bearing unit 240 may be achieved and rigidities of the rotation guides 220 and the bearing unit 240 in a rotating direction may be obtained through the flexible hinge 220*c*. In example embodiments, the main frame 250 may be provided with a recess 250*c* in which the flexible hinge 220*c* may be disposed.

In example embodiments the flexible hinge 220*c* may be fixedly mounted to the rotation guide 220 and the bearing unit 240 by a fastening device, for example, screws, after the position adjustment of the rotation guide 220 by the interval adjustment unit 242 and the interval maintenance unit 243 is completed to prevent the rotation guide 220 from further rotating with respect to the bearing unit 240. Also, the flexible hinge 220*c* may be made of a flexible material. Accordingly, although the flexible hinge 220*c* may be fixedly mounted to the rotation guide 220 and the bearing unit 240, it can be maintained in parallel to the lower surface of the rotation guide 220 and the upper surface of the bearing unit 240.

Figure 6:
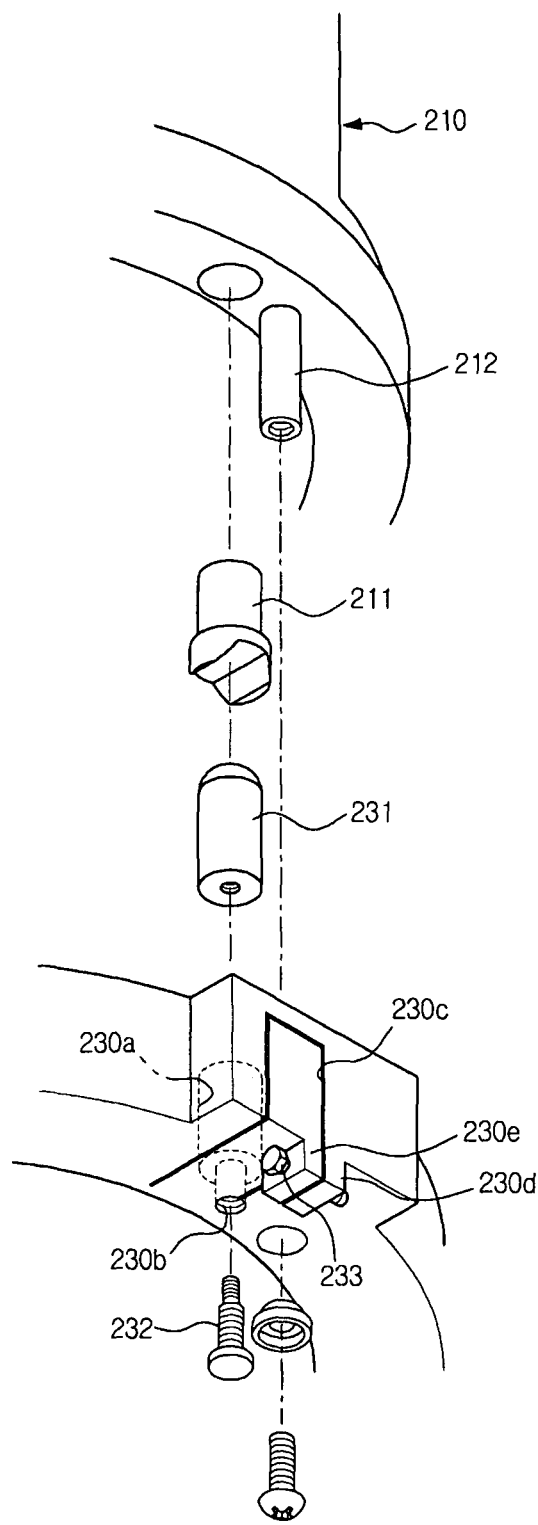
FIG. 6 is a perspective view illustrating installation of tilting guides applied to the maskless exposure apparatus in accordance with example embodiments.

As shown in FIG. 6, the tilting frame 230 may include tilting guides 231 that may be movable forward and backward. In example embodiments, the tilting guides 231 may be respectively provided with the front ends that support the lower end of the guide frame 210, and differential tilting screws 232 that may be connected to the tilting frame 230 and may move forward and backward in the axial direction according to the rotating direction thereof to move the tilting guides 231 forward and backward. The tilting frame 230 may further include tilting guide holes 230*a* in which the tilting guides 231 may be movable forward and backward and tilting screw holes 230*b* with which the differential tilting screws 232 may be coupled. In example embodiments, support members 211 contacting the front ends of the tilting guides 231 may be installed on the lower end of the guide frame 210. The tilting screw 232 may include two different threaded regions and the pitch of the threads of the two regions may be different from one another. For example, a screw pitch of a portion of the differential tilting screw 232 contacting the tilting guide 231 and a screw pitch of a portion of the differential tilting screw 232 contacting the tilting frame 230 may differ from each other. Therefore, through the screw pitch of the portion of the differential tilting screw 232 coupled with the tilting guide 231 and the screw pitch of the portion of the differential tilting screw 232 coupled with the tilting frame 230, the tilting guide 231 may be finely adjusted.

Figure 7:
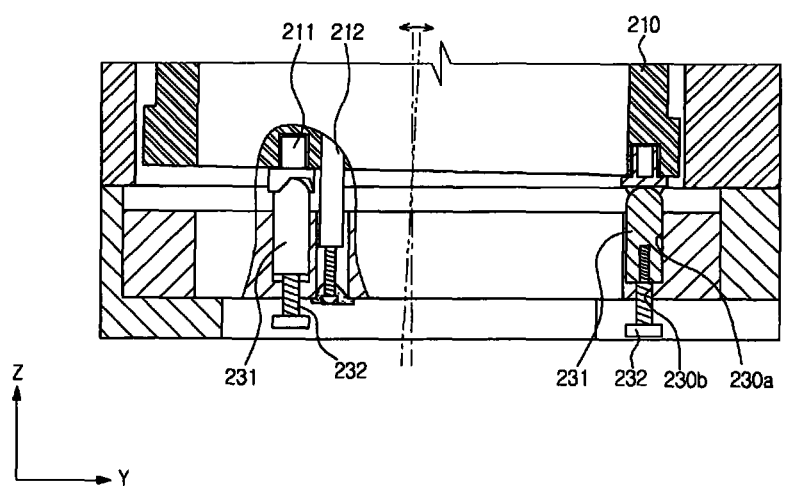
FIG. 7 is a partial cross-sectional view illustrating operation of the tilting guides applied to the maskless exposure apparatus in accordance with example embodiments.

In example embodiments, a plurality of tilting guides 231 may be provided and the plurality of tilting guides 231 may be separated from each other in the circumferential direction. Likewise, a plurality of differential tilting screws 232 separated from each other in the circumferential direction may also be provided. The guide frame 210 may be rotated (tilted) around the Y axis and the X axis by adjusting relative positions of the tilting guides 231 by rotating the differential tilting screws 232. FIG. 7 illustrates a tilted state of the guide frame 210 around the X axis by the tilting guides 231. Further, although not shown, the guide frame 210 may be tilted around the second axis Y in the same manner by adjusting the relative positions of the tilting guides 231.

Figure 8:
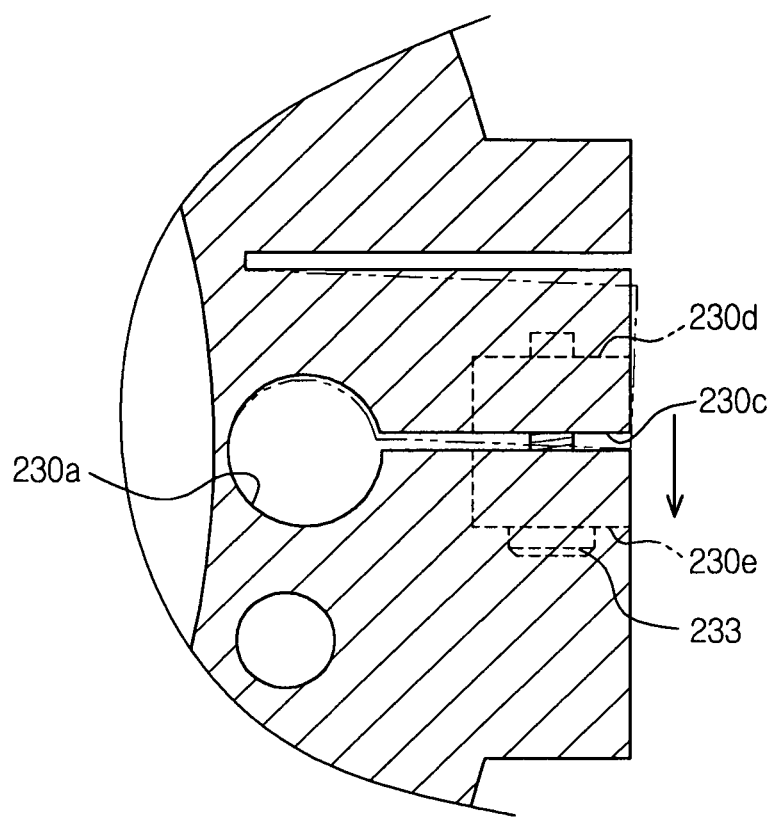
FIG. 8 is a partial cross-sectional view illustrating a clamping method of the tilting guide applied to the maskless exposure apparatus in accordance with example embodiments.

In example embodiments, clamping grooves 230*c* may be provided on the tilting frame 230. The clamping grooves 230*c* may protrude partial regions of the inner surfaces of the tilting guide holes 230*a* toward the insides of the tilting guide holes 230*a* to clamp the tilting guides 231 in the tilting guide holes 230*a*. Further, a first clamping part 230*d* and a second clamping part 230*e* may respectively extend from regions of the tilting frame 230 adjacent to both sides of the clamping groove 230*c*, and a clamping screw 233 may be installed through the first clamping part 230*d* and the second clamping part 230*e*. Therefore, when an interval between the first clamping part 230*d* and the second clamping part 230*e* is adjusted by rotating the clamping screw 233, as shown in FIG. 8, the clamping groove 230*c* is narrowed and thus the tilting guide hole 230*a* is narrowed, thereby clamping the tilting guide 231 to the inner surface of the tilting guide hole 230*a* and thus preventing or reducing movement of the tilting guide 231.

Figure 2:
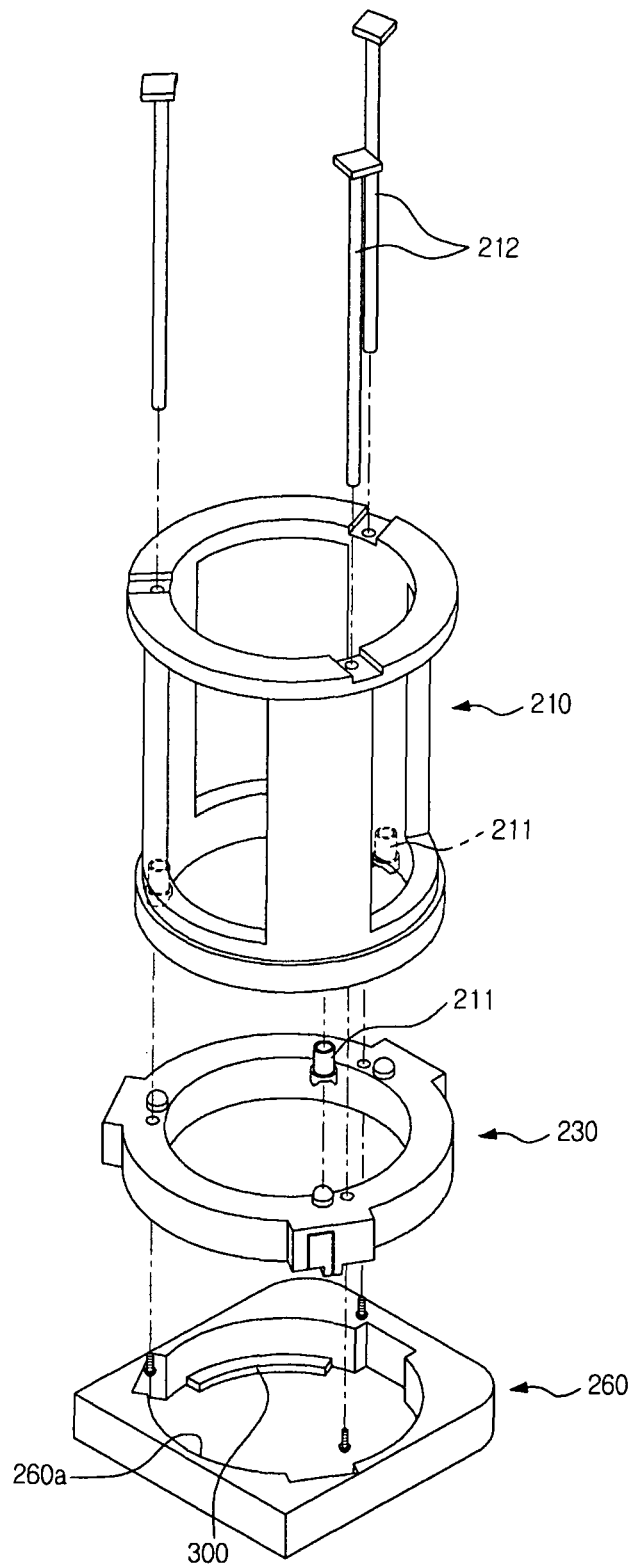
FIGS. 2 and 3 are exploded perspective views of a lens barrel support device applied to the maskless exposure apparatus in accordance with example embodiments.

The guide frame 210 may be fixed to the tilting frame 230 under the condition that the guide frame 210 is supported by the tilting guides 231 in the unmovable state, and fixing pins 212 to fix the guide frame 210 to the tilting frame 230 may be provided, as shown in FIG. 2. The fixing pins 212 may pass through the guide frame 210 and the tilting frame 230 and the lower ends of the fixing pins 212 may be fixed to the tilting frame 230 by fastening members, for example, screws. Thus, the guide frame 210 may be fixed to the tilting frame 230 under the condition that the lower end of the guide frame 210 is supported by the front ends of the tilting guides 231.

Figure 9:
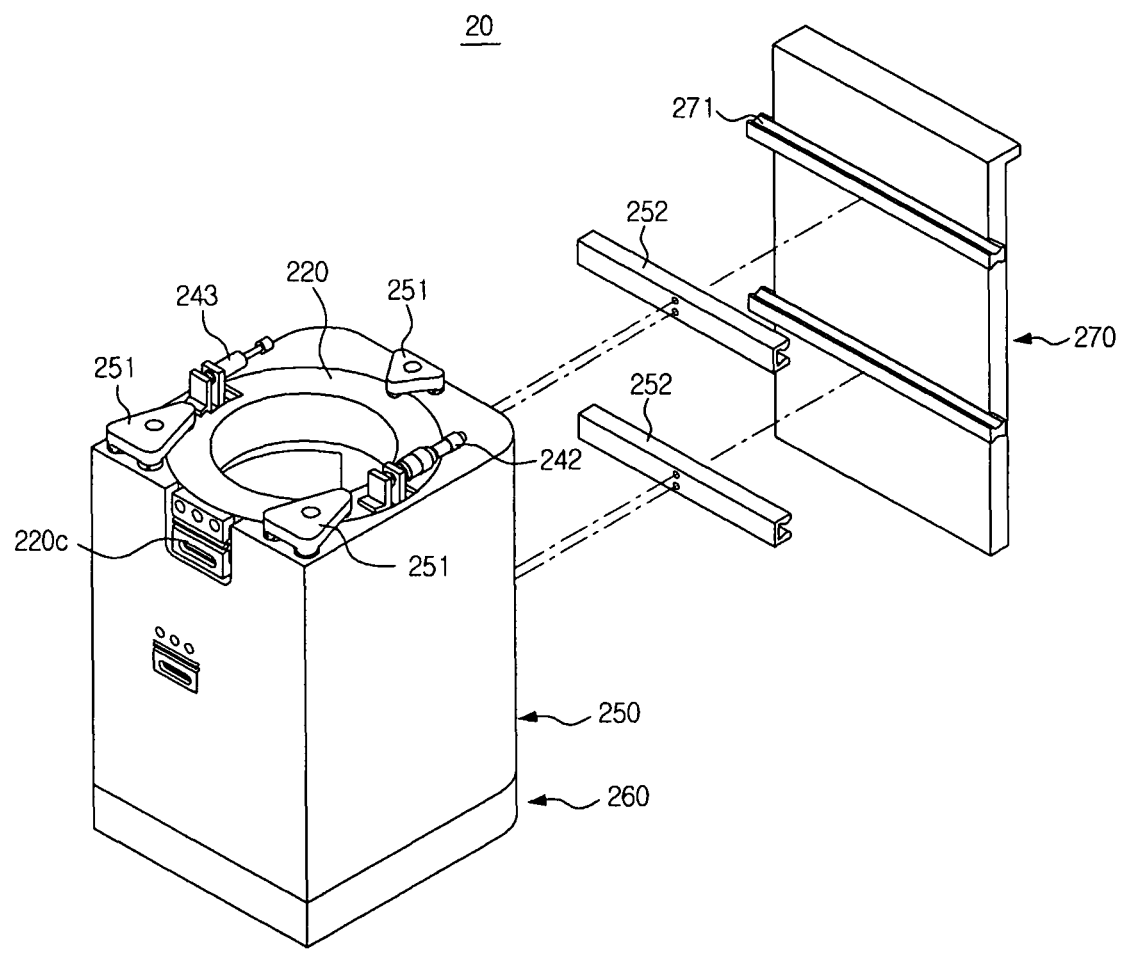
FIG. 9 is a perspective view illustrating installation of the lens barrel support device applied to the maskless exposure apparatus in accordance with example embodiments.

Further, the main frame 250 may be configured so as to move forward and backward in the direction of the X axis, thereby moving the lens barrel 10 in the direction of the X axis. For this reason, a movement guide 270 to support the main frame 250 such that the main frame 250 can move forward and backward in the direction of the X axis may be installed on the barrel support device 20, and first rails 252 and second rails 271 may be respectively installed on the main frame 250 and the movement guide 270, as shown in FIG. 9.

As is apparent from the above description, a barrel support device in accordance with example embodiments supports a lens barrel such that the lens barrel can be rotated around a first axis and can be tilted around a second axis and a third axis that are perpendicular to each other, thereby finely adjusting position and angle of the lens barrel Further, even if a position and an angle of the lens barrel are changed during use, the barrel support device may finely re-adjust the position and angle of the lens barrel.

Although example embodiments have been shown and described, it would be appreciated by those skilled in the art that changes may be made in example embodiments without departing from the principles and spirit of the invention, the scope of which is defined in the claims and their equivalents.

What is claimed is:

1. A barrel support device configured to support a lens barrel, comprising:
   a guide frame configured to laterally support the lens barrel and tilt with the lens barrel;
   a rotation guide on a first end of the guide frame, the rotation guide being ring shaped and configured to attach the lens barrel to the guide frame;
   a ring-shaped tilting frame configured to support a second end of the guide frame and tilt the guide frame, wherein the guide frame, the rotation guide, and the ring-shaped tilting frame are configured to allow the lens barrel to pass therethrough;
   a main frame configured to at least one of tiltably and rotatably support the guide frame;
   a sub frame having one end attached to the main frame, the subframe configured to support the ring-shaped tilting frame; and
   a bearing unit between the rotation guide and the guide frame to rotatably attach the rotation guide to the guide frame.

2. The barrel support device according to claim 1, further comprising:
   a plurality of separation prevention members on the main frame configured to support the rotation guide so as to maintain the rotation guide, the bearing unit, and the guide frame in an installed state, wherein the main frame includes a through hole to accommodate the guide frame.

3. The barrel support device according to claim 2, wherein the plurality of separation prevention members is separated from each other circumferentially around the rotation guide.

4. The barrel support device according to claim 1, wherein the rotation guide is configured to attach to the lens barrel at a position corresponding to a center of gravity of the lens barrel.

5. The barrel support device according to claim 1, further comprising:
   first guide members on the rotation guide;
   second guide members on the bearing unit corresponding to the first guide members; and
   an interval adjustment unit configured to adjust an interval between the first guide members and the second guide members.

6. The barrel support device according to claim 5, wherein the rotation guide includes recesses configured to accommodate the second guide members and allow the first guide members to move in the circumferential direction.

7. The barrel support device according to claim 5, further comprising:
   an interval maintenance unit configured to maintain an interval between the first guide members and the second guide members, wherein the first guide members and the second guide members are provided in pairs so as to correspond to each other, and an interval between one of the first guide members and one of the second guide members is adjusted by the interval adjustment unit.

8. The barrel support device according to claim 5, further comprising:
   a flexible hinge having one side attached to the rotation guide and a second side attached to the bearing unit, the flexible hinge being configured to allow relative displacements of the rotation guide and the bearing unit and to have rigidities of the rotation guide and the bearing unit in a rotating direction.

9. The barrel support device according to claim 1, further comprising:
   a plurality of tilting guides on the ring-shaped tilting frame, the tilting guides being circumferentially separated from each other, the plurality of tilting guides being configured to move forward and backward and provided with front ends to support the second end of the guide frame, wherein the ring-shaped tilting frame includes tilting guide holes to allow the tilting guides to move forward and backward.

10. The barrel support device according to claim 9, further comprising:
    differential tilting screws screw-connected to the ring-shaped tilting frame, the differential tilting screws configured to move forward and backward according to a rotating direction thereof to move the tilting guides and the guide frame forward and backward, wherein the ring-shaped tilting frame includes tilting screw holes with which the differential tilting screws are engaged.

11. The barrel support device according to claim 9, further comprising:
    support members on the second end of the guide frame configured to contact the front ends of the tilting guides.

12. The barrel support device according to claim 9, further comprising:
    clamping screws each of which is screw-connected to a first clamping part of the ring-shaped tilting frame and a second clamping part of the ring-shaped tilting frame to adjust an interval between the first clamping part and the second clamping part, wherein the ring-shaped tilting frame includes clamping grooves to protrude partial regions of the tilting guide holes to insides of the tilting guide holes, and the first clamping part and the second clamping part extend from regions of the ring-shaped tilting frame adjacent to both sides of the clamping grooves.

13. The barrel support device according to claim 9, further comprising:
    fixing pins passing through the guide frame and the sub frame to maintain a supported state of the second end of the guide frame by the front ends of the tilting guides.

14. The barrel support device according to claim 1, further comprising:
    a movement guide attached to the main frame, the movement guide configured to move the main frame forward and backward in a direction of a first axis; and
    first rails and second rails extending in a direction of a second axis to attach the main frame to the movement guide such that the main frame can move forward and backward in the direction of the first axis.

15. A maskless exposure apparatus comprising:
    at least one lens barrel configured to irradiate a substrate with light; and
    at least one barrel support device according to claim 1 configured to support the at least one lens barrel.

16. The maskless exposure apparatus according to claim 15, wherein:
    the substrate is configured to move in a direction different from a direction on which the light is irradiated onto the substrate.

17. The maskless exposure apparatus according to claim 15, wherein the at least one lens barrel is one of a plurality of lens barrels arranged in a plurality of rows, the plurality of rows extending in a direction perpendicular to a direction in which the substrate is configured to move and is perpendicular to a direction on which the light is irradiated onto the substrate.

18. The maskless exposure apparatus according to claim 15, wherein the at least one barrel support device further comprises
the sub frame, into which the ring-shaped tilting frame is fixed, provided with one end fixed to the main frame.

19. The maskless exposure apparatus according to claim 18, wherein the at least one barrel support device further includes:
a pair of first guide members on the rotation guide;
a pair of second guide members on the bearing unit corresponding to the first guide members;
an interval adjustment unit configured to adjust an interval between one of the pair of first guide members and one of the pair of second guide members; and
an interval maintenance unit configured to maintain an interval between the other one of the pair of first guide members and the other one of the pair of the second guide members.

20. The maskless exposure apparatus according to claim 18, wherein each barrel support device further includes:
a plurality of tilting guides on the ring-shaped tilting frame, the plurality of tilting guides being separated from each other in the circumferential direction and installed such that they can move forward and backward, the plurality of tilting guides respectively provided with front ends to support the second end of the guide frame;
differential tilting screws screw-connected to the ring-shaped tilting frame and moving forward and backward in the axial direction according to the rotating direction thereof to move the tilting guides and the guide frame forward and backward, wherein
the ring-shaped tilting frame including tilting guide holes in which the tilting guides are installed such that they can move forward and backward and tilting screw holes with which the differential tilting screws are respectively coupled.

* * * * *